United States Patent
Rowley

(10) Patent No.: US 11,815,977 B2
(45) Date of Patent: *Nov. 14, 2023

(54) POWER TRANSLATOR COMPONENT

(71) Applicant: Micron Technology, Inc., Boise, ID (US)

(72) Inventor: Matthew D. Rowley, Boise, ID (US)

(73) Assignee: Micron Technology, Inc., Boise, ID (US)

(*) Notice: Subject to any disclaimer, the term of this patent is extended or adjusted under 35 U.S.C. 154(b) by 0 days.

This patent is subject to a terminal disclaimer.

(21) Appl. No.: 17/560,790

(22) Filed: Dec. 23, 2021

(65) Prior Publication Data

US 2022/0113786 A1 Apr. 14, 2022

Related U.S. Application Data

(63) Continuation of application No. 16/287,162, filed on Feb. 27, 2019, now Pat. No. 11,226,671.

(51) Int. Cl.
*G06F 1/3234* (2019.01)
*G11C 16/30* (2006.01)
*G06F 1/26* (2006.01)

(52) U.S. Cl.
CPC .......... *G06F 1/3275* (2013.01); *G06F 1/266* (2013.01); *G11C 16/30* (2013.01)

(58) Field of Classification Search
CPC ........ G06F 1/3275; G06F 1/266; G11C 16/30
See application file for complete search history.

(56) References Cited

U.S. PATENT DOCUMENTS

| 5,963,019 | A | * | 10/1999 | Cheon | ...................... | H02H 7/18 320/134 |
|---|---|---|---|---|---|---|
| 7,072,779 | B2 | | 7/2006 | Hancock et al. | | |
| 9,323,304 | B2 | | 4/2016 | Salessi et al. | | |
| 10,037,258 | B2 | | 7/2018 | Cunningham et al. | | |
| 2002/0087907 | A1 | | 7/2002 | Poisner | | |
| 2008/0247252 | A1 | | 10/2008 | Ruf et al. | | |
| 2009/0278517 | A1 | | 11/2009 | Kleveland | | |

(Continued)

FOREIGN PATENT DOCUMENTS

| CN | 103150235 A | 6/2013 |
|---|---|---|
| CN | 104104058 A | 10/2014 |

(Continued)

OTHER PUBLICATIONS

Office Action and Search Report from reltaed Taiwan patent application No. 109104016, dated Apr. 16, 2021, 17 pages.

(Continued)

*Primary Examiner* — Jaweed A Abbaszadeh
*Assistant Examiner* — Hyun Soo Kim
(74) *Attorney, Agent, or Firm* — Brooks, Cameron & Huebsch, PLLC

(57) ABSTRACT

An apparatus includes a power management integrated circuit (PMIC) and a power translator component coupled to the PMIC. The power translator component supplies power to the PMIC. The power translator component can further receive, from the PMIC, an indication that the PMIC has experienced a thermal event and responsive to receipt of the indication that the PMIC has experienced the thermal event, prevent powering of the PMIC.

17 Claims, 3 Drawing Sheets

(56) References Cited

U.S. PATENT DOCUMENTS

| | | | |
|---|---|---|---|
| 2010/0188785 A1* | 7/2010 | Gascuel | H02H 3/033 |
| | | | 361/18 |
| 2010/0211808 A1 | 8/2010 | Jeong et al. | |
| 2011/0029150 A1* | 2/2011 | Wyatt | G06F 1/206 |
| | | | 700/299 |
| 2012/0272086 A1* | 10/2012 | Anderson | G06F 1/206 |
| | | | 713/340 |
| 2014/0028377 A1* | 1/2014 | Rosik | G05F 3/02 |
| | | | 327/513 |
| 2014/0238978 A1* | 8/2014 | Kitaizumi | H05B 6/06 |
| | | | 219/661 |
| 2015/0261266 A1 | 9/2015 | Dean et al. | |
| 2015/0331469 A1 | 11/2015 | Ristic | |
| 2015/0355033 A1* | 12/2015 | Zhang | G01K 7/015 |
| | | | 374/170 |
| 2016/0054788 A1 | 2/2016 | Gulati et al. | |
| 2017/0031782 A1 | 2/2017 | Tolten et al. | |
| 2017/0069356 A1 | 3/2017 | Schmidt | |
| 2017/0070071 A1* | 3/2017 | Han | G06F 1/3215 |
| 2017/0222463 A1* | 8/2017 | Pullen | H02J 7/04 |
| 2018/0152052 A1 | 5/2018 | Lee et al. | |
| 2018/0284857 A1* | 10/2018 | Yang | G11C 5/04 |
| 2019/0132277 A1 | 5/2019 | Keshava | |
| 2019/0369683 A1* | 12/2019 | Vishnubhatla | G06F 9/442 |
| 2020/0279588 A1 | 9/2020 | Lym | |

FOREIGN PATENT DOCUMENTS

| | | |
|---|---|---|
| CN | 104487911 A | 4/2015 |
| CN | 107085462 A | 8/2017 |
| TW | 201800894 A | 1/2018 |

OTHER PUBLICATIONS

International Search Report and Written Opinion from related international application No. PCT/US2002/014522, dated May 26, 2020, 12 pages.

Office Action and Search Report from related Taiwan patent application No. 109104016 dated Sep. 22, 2021, 17 pages.

First Office Action from related Chinese Patent Application No. 202080016851.9, dated Mar. 16, 2022, 26 pages.

Yang Zhilian, et al., "Introduction to Very Large Scale Integrated Circuit Design Methodology," the second edition, Tsinghua University Press, Mar. 31, 1999, 3 pages.

Zhang Xingwei, "Principles and Maintenance of Fashionable Digital Mobile Phones (I)", People's Posts and Telecommunications Press, Apr. 30, 2001, 6 pages.

Li Xueyong, et al., "Notes of Mobile Phone Fault Repair," Defense Industry Press, Jan. 31, 2010, 3 pages.

* cited by examiner

POWER TRANSLATOR COMPONENT

PRIORITY INFORMATION

This application is a Continuation of U.S. application Ser. No. 16/287,162, filed Feb. 27, 2019, the contents of which are incorporated herein by reference.

TECHNICAL FIELD

Embodiments of the disclosure relate generally to memory sub-systems, and more specifically, relate to a power translator component.

BACKGROUND

A memory sub-system can be a storage system, such as a solid-state drive (SSD), and can include one or more memory components that store data. The memory components can be, for example, non-volatile memory components and volatile memory components. In general, a host system can utilize a memory sub-system to store data at the memory components and to retrieve data from the memory components.

BRIEF DESCRIPTION OF THE DRAWINGS

The present disclosure will be understood more fully from the detailed description given below and from the accompanying drawings of various embodiments of the disclosure.

DETAILED DESCRIPTION

Figure 1:
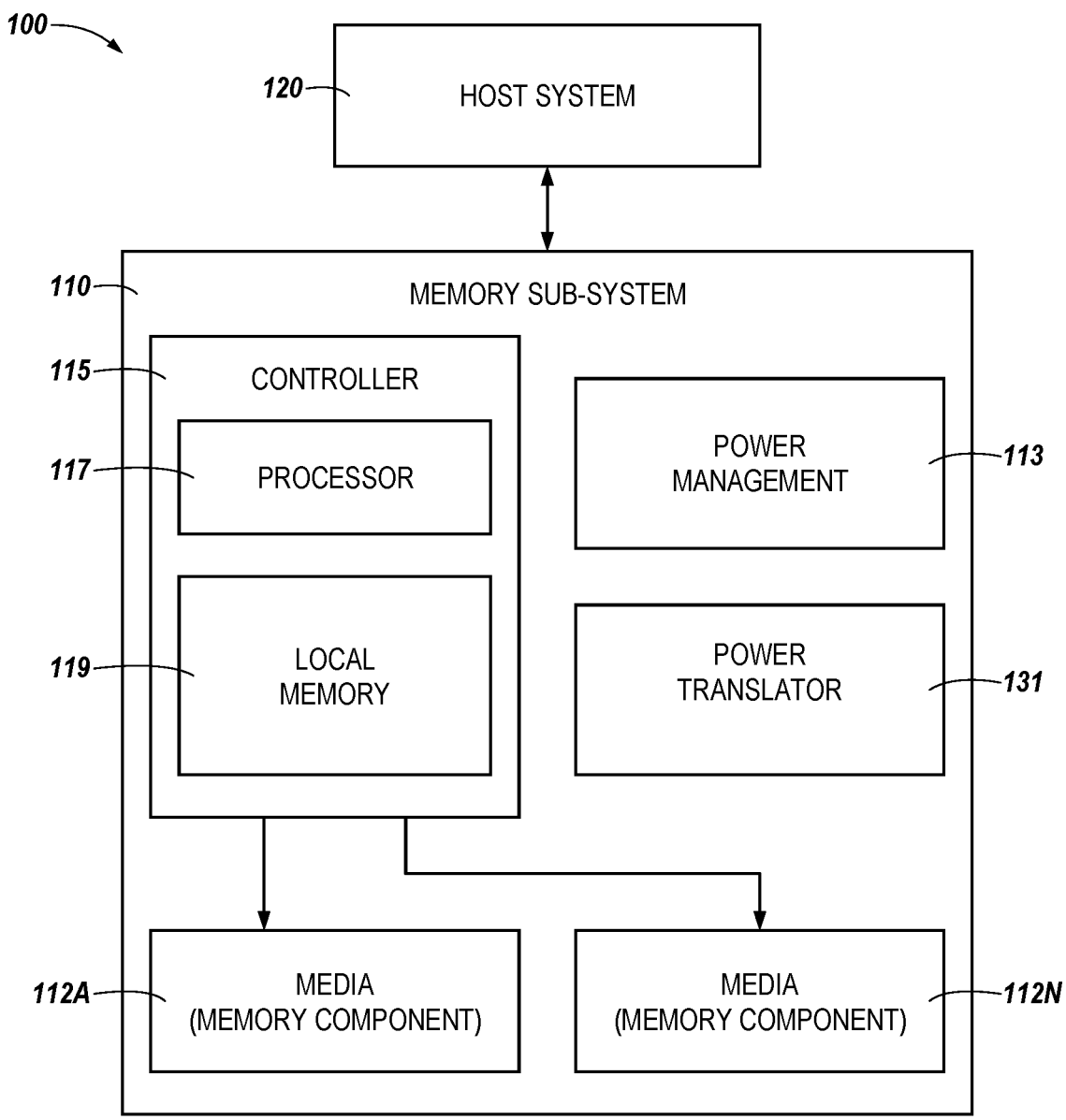
FIG. 1 illustrates an example computing environment that includes a memory sub-system in accordance with some embodiments of the present disclosure.

Aspects of the present disclosure are directed to memory sub-systems that include a component dedicated to power management. A memory sub-system is also hereinafter referred to as a "memory device." An example of a memory sub-system is a storage system, such as a solid-state drive (SSD). In some embodiments, the memory sub-system is a hybrid memory/storage sub-system. In general, a host system can utilize a memory sub-system that includes one or more memory components. The host system can provide data to be stored at the memory sub-system and can request data to be retrieved from the memory sub-system.

Memory sub-systems (e.g., SSDs) can include a power management component such as a power management integrated circuit (PMIC), which can be used to manage various power requirements of the memory sub-system and/or electronic devices coupled thereto. In embodiments described herein, a memory sub-system can further include a power translator component, which can be used to regulate power (e.g., a voltage) supplied to the power management component and/or provide back-up power to the power management component.

Some conventional power management components can include one or more thermal sensors to measure and/or record the temperature of the power management component while in operation. In some approaches, the recorded temperature information of the power management component can be stored in volatile memory located within the power management component.

The temperature information can be used to determine if the power management component is experiencing, or has experienced, a thermal event. As used herein, a "thermal event" generally refers to a condition experienced by a power management component as a result of the temperature of the power management component. For example, a thermal event can refer to a condition in which the power management component is operating at or above a safe operating temperature range of the power management component. In a non-limiting example, a thermal event can refer to a thermal runaway condition experienced by a power management component in which an increase in temperature changes thermal conditions of the power management component such that a further increase in temperature is realized. A thermal event can be caused by an electrical short in the power management component, an electrical short in circuitry coupled to the power management component, and/or a workload being too great for the power management component, among other conditions that can give rise to the power management component experiencing elevated temperatures.

In some approaches, the temperature information can be used in diagnosing and/or troubleshooting a power management component that has experienced a thermal event. For example, if the power management component has experienced a non-critical thermal event (e.g., a thermal event in which the power management component does not fail), the temperature information can be analyzed to determine the cause of the thermal event. This can assist in diagnosing issues with a power management component and/or troubleshooting such issues. However, if the volatile memory in which the temperature information is stored loses power, for example, as a result of the power management component failing due to the thermal event, the temperature information can be lost, thereby rendering diagnosis of the thermal event and/or troubleshooting of the thermal event difficult or impossible.

For example, in approaches in which the temperature information of the power management component is stored in volatile memory located on the power management component, the temperature information can be lost if the power management component loses power. That is, if the power management component overheats to the point of failure as a result of the thermal event, the temperature information can, in some approaches, be lost, thereby making a determination regarding characteristics of the power management component leading up to the failure and, ultimately, the cause of the thermal event that led to the failure of the power management component difficult or even impossible. This can render troubleshooting of the power management component difficult or impossible and can lead to scenarios in which future generations of power management components can suffer from similar thermal events to their predecessors.

In contrast, aspects of the present disclosure address the above and other deficiencies by providing circuitry external to the power management component that can utilize the temperature information for various purposes. In some embodiments, the circuitry external to the power management component is provided in the form of a power translator component that can, among other things, regulate power supplied to the power management component, provide back-up power to the power management component, and/or store temperature information measured and/or recorded by the power management component.

For example, as described in more detail, herein, the power translator component can receive temperature information from the power management component and/or an indication that the power management component has experienced a thermal event. In order to reduce the temperature of the power management component, in some embodiments, the power translator component can prevent, at least temporarily, supply of power to the power management component, which can decrease the temperature of the power management component and mitigate effects of the thermal event on the power management component.

In some embodiments, the power translator component can include a memory resource that can be used to store temperature information and/or an indication that the power management component is experiencing, or has experienced, a thermal event received from the power management component. In the event that the power management component fails due to a thermal event (or experiences a failure due to other circumstances), the temperature information and/or indication received from the power management component and stored by the memory resource of the power translator component can be still be accessible for diagnostic and/or troubleshooting purposes. As described in more detail, herein, the memory resource of the power translator component can be volatile and/or non-volatile, but in embodiments in which the memory resource of the power translator component is volatile, the information stored thereon can still be accessible in the event of a failure of the power management component as the power translator component can maintain power to the memory resource despite failure of the power management component.

FIG. 1 illustrates an example computing environment 100 that includes a memory sub-system 110 in accordance with some embodiments of the present disclosure. The memory sub-system 110 can include media, such as memory components 112A to 112N. The memory components 112A to 112N can be volatile memory components, non-volatile memory components, or a combination of such. In some embodiments, the memory sub-system is a storage system. An example of a storage system is a solid-state drive (SSD). In some embodiments, the memory sub-system 110 is a hybrid memory/storage sub-system. In general, the computing environment 100 can include a host system 120 that uses the memory sub-system 110. For example, the host system 120 can write data to the memory sub-system 110 and read data from the memory sub-system 110.

The host system 120 can be a computing device such as a desktop computer, laptop computer, network server, mobile device, or other such computing device that includes a memory and a processing device. The host system 120 can include or be coupled to the memory sub-system 110 so that the host system 120 can read data from or write data to the memory sub-system 110. The host system 120 can be coupled to the memory sub-system 110 via a physical host interface. As used herein, "coupled to" generally refers to a connection between components, which can be an indirect communicative connection or direct communicative connection (e.g., without intervening components), whether wired or wireless, including connections such as electrical, optical, magnetic, etc. Examples of a physical host interface include, but are not limited to, a serial advanced technology attachment (SATA) interface, a peripheral component interconnect express (PCIe) interface, universal serial bus (USB) interface, Fibre Channel, Serial Attached SCSI (SAS), etc. The physical host interface can be used to transmit data between the host system 120 and the memory sub-system 110. The host system 120 can further utilize an NVM Express (NVMe) interface to access the memory components 112A to 112N when the memory sub-system 110 is coupled with the host system 120 by the PCIe interface. The physical host interface can provide an interface for passing control, address, data, and other signals between the memory sub-system 110 and the host system 120.

The memory components 112A to 112N can include any combination of the different types of non-volatile memory components and/or volatile memory components. An example of non-volatile memory components includes a negative-and (NAND) type flash memory. Each of the memory components 112A to 112N can include one or more arrays of memory cells such as single level cells (SLCs) or multi-level cells (MLCs) (e.g., triple level cells (TLCs) or quad-level cells (QLCs)). In some embodiments, a particular memory component can include both an SLC portion and a MLC portion of memory cells. Each of the memory cells can store one or more bits of data (e.g., data blocks) used by the host system 120. Although non-volatile memory components such as NAND type flash memory are described, the memory components 112A to 112N can be based on various other types of memory such as a volatile memory. In some embodiments, the memory components 112A to 112N can be, but are not limited to, random access memory (RAM), read-only memory (ROM), dynamic random access memory (DRAM), synchronous dynamic random access memory (SDRAM), phase change memory (PCM), magneto random access memory (MRAM), negative-or (NOR) flash memory, electrically erasable programmable read-only memory (EEPROM), and a cross-point array of non-volatile memory cells. A cross-point array of non-volatile memory can perform bit storage based on a change of bulk resistance, in conjunction with a stackable cross-gridded data access array. Additionally, in contrast to many flash-based memories, cross-point non-volatile memory can perform a write in-place operation, where a non-volatile memory cell can be programmed without the non-volatile memory cell being previously erased. Furthermore, the memory cells of the memory components 112A to 112N can be grouped as memory pages or data blocks that can refer to a unit of the memory component used to store data.

The memory system controller 115 (hereinafter referred to as "controller") can communicate with the memory components 112A to 112N to perform operations such as reading data, writing data, or erasing data at the memory components 112A to 112N and other such operations. The controller 115 can include hardware such as one or more integrated circuits and/or discrete components, a buffer memory, or a combination thereof. The controller 115 can be a microcontroller, special purpose logic circuitry (e.g., a field programmable gate array (FPGA), an application specific integrated circuit (ASIC), etc.), or other suitable processor. The controller 115 can include a processing device (e.g., processor 117) configured to execute instructions stored in local memory 119. In the illustrated example, the local memory 119 of the controller 115 includes an embedded memory configured to store instructions for performing various processes, operations, logic flows, and routines that control operation of the memory sub-system 110, including handling communications between the memory sub-system 110 and the host system 120. In some embodiments, the local memory 119 can include memory registers storing memory pointers, fetched data, etc. The local memory 119 can also include read-only memory (ROM) for storing micro-code. While the example memory sub-system 110 in FIG. 1 has been illustrated as including the controller 115, in another embodiment of the present disclosure, a memory sub-system 110 may not include a controller 115, and can instead rely upon external control (e.g., provided by an external host, or by a processor or controller separate from the memory sub-system).

In general, the controller 115 can receive commands or operations from the host system 120 and can convert the commands or operations into instructions or appropriate commands to achieve the desired access to the memory components 112A to 112N. The controller 115 can be responsible for other operations such as wear leveling operations, garbage collection operations, error detection and error-correcting code (ECC) operations, encryption operations, caching operations, and address translations between a logical block address and a physical block address that are associated with the memory components 112A to 112N. The controller 115 can further include host interface circuitry to communicate with the host system 120 via the physical host interface. The host interface circuitry can convert the commands received from the host system into command instructions to access the memory components 112A to 112N as well as convert responses associated with the memory components 112A to 112N into information for the host system 120.

Although not explicitly shown in FIG. 1, in some embodiments, the controller 115 includes at least a portion of the power management component 113 and/or the power translator component 131. For example, the controller 115 can include a processor 117 (e.g., a processing device) configured to execute instructions stored in local memory 119 for performing the operations described herein. In some embodiments, the power management component 113 and/or the power translator component 131 is part of the host system 120, an application, or an operating system.

The memory sub-system 110 can also include additional circuitry or components that are not illustrated. For instance, the memory components 112A to 112N can include control circuitry, address circuitry (e.g., row and column decode circuitry), and/or input/output (I/O) circuitry by which they can communicate with controller 115 and/or host 120. As an example, in some embodiments, the address circuitry can receive an address from the controller 115 and decode the address to access the memory components 112A to 112N.

The memory sub-system 110 includes a power management component 113 (e.g., a PMIC) that can be configured to provide power to the memory components 112A to 112N. Although not shown in FIG. 1 so as to not obfuscate the drawings, the power management component 113 can include various circuitry to facilitate providing power to the memory components 112A to 112N, the controller 115, and/or other components of the memory sub-system 110. For example, the power management component 113 can include a sequencer, one or more switches, and/or one or more regulators (e.g., buck regulators, low-dropout regulators, etc.) that can allow the power management component 113 to provide power to various memory components 112A to 112N coupled thereto. In addition, the power management component 113 can include one or more thermal sensors that can detect a temperature of the power management component 113 during operation.

The memory sub-system 110 further includes a power translator component 131. As described in more detail in connection with FIG. 2, the power translator component 131 can include control circuitry (e.g., the translator controller 232 illustrated in FIG. 2), a regulator (e.g., the regulator 234 illustrated in FIG. 2), isolation device(s) (e.g., the isolation device(s) 236 illustrated in FIG. 2), and/or a memory resource (e.g., the memory resource 238 illustrated in FIG. 2).

The power translator component 131 can be configured to regulate power (e.g., a voltage) supplied to the power management component 113 and/or provide back-up power to the power management component 113. The power translator component 131 can, in some embodiments, be a power management integrated circuit (PMIC) or can perform at least some functions associated with a PMIC. In some embodiments, as described in more detail in connection with FIG. 2, the power translator component 131 can receive, from the power management component 113, an indication that the power management component 113 has experienced a thermal event and, responsive to receipt of the indication that the power management component 113 has experienced the thermal event, prevent powering of the power management component 113. In some embodiments, power translator component 131 can prevent powering of the power management component 113 temporarily.

In some embodiments, the indication can be transferred from the power management component 113 to the power translator component 131 via activation of a status condition pin (e.g., a PMIC status condition pin) coupled to the power management component 113. The PMIC status condition pin can be communicatively coupled to a status condition pin coupled to the power translator component 131, which can be configured to receive the indication from the power management component 113. The status condition pin of the power management component 113 and/or the status condition pin of the power translator component 131 can include pins that are generally included within the power management component 113 and/or the power translator component 131, or the status condition pins can be specialized pins utilized for the purpose of transferring temperature information and/or the indication that the power management component has experienced, or is experiencing, a thermal event from the power management component 113 to the power translator component 131.

The indication can include, for example, information indicating that the power management component 113 has experienced a thermal event such as an over temperature event, a thermal runaway event, or other event indicative of the power management component 113 experiencing temperatures that are near or above a safe operating temperature range of the power management component 113. As used herein, a "safe operating range" generally refers to a temperature range at which the power management component 113 can operate without risk of damage to, or failure of, the power management component 113. In some embodiments, the indication can correspond to a workload experienced by the power management component 113. For example, because a workload assigned to the power management component 113 can, depending on the amount of work associated with the workload, give rise to a temperature increase of the power management component 113, a workload assigned to the power management component 113 can be indicative of a thermal event experienced by the power management component 113.

The indication can include a bit (e.g., a flag) such as a "0" or "1" that indicates that the power management component 113 has experienced a thermal event. Embodiments are not so limited, however, and in some embodiments the indication can include a plurality of bits (e.g., a bit string), a word, machine-readable code, or other suitable indication so long as the indication contains information regarding the temperature at which the power management component 113 is operating and/or information regarding the power management component 113 experiencing a thermal event.

The indication can include temperature information detected by the thermal sensors of the power management component 113. The temperature information of the power management component 113 can include instantaneous temperature information that is measured at a particular point in time by the power management component 113, averaged temperature information based on temperature information collected by the power management component 113 over time, delta temperature information corresponding to a change in a temperature detected by the power management component 113 over a given period of time, etc. The power translator component 131 can, in some embodiments, use the received temperature information to determine whether or not to prevent powering of the power management component 113 (at least temporarily) to, for example, allow the power management component 113 to experience a reduction in temperature.

As described in more detail in connection with FIG. 2, herein, preventing powering of the power management component 113 can include operating one or more components within the power translator component 131 to stop providing a supply voltage to the power management component 113. The power translator component 131 can be configured to prevent powering of the power management component 113 for a predetermined period of time after which the power translator component 131 can resume supplying power to the power management component 113. If the power translator component 131 receives a subsequent indication from the power management component 113 that the power management component 113 is still experiencing the thermal event, the power translator component 131 can again prevent powering of the power management component 113. In some embodiments, the threshold period of time may not be predetermined and instead can be controlled by the power translator component 131. For example, in some embodiments, the power translator component 131 can dynamically determine a period of time to prevent powering the power management component 113. Stated alternatively, the power translator component 113 can determine how long power is not supplied to the power management component 131.

In a number of embodiments, the power translator component 131 can prevent powering of the power management component 113 until subsequent temperature information and/or a subsequent indication is received by the power translator component 131 that the temperature of the power management component 113 has reached a particular threshold temperature. In addition, or in the alternative, the power management component 131 can receive a second indication from the power management component 113 that it is safe to provide power to the power management component 113 again, and the power translator component 131 can apply power to the power management component 113 in response to the second indication.

In contrast to approaches that do not employ circuitry that functions as the power translator component 131 of the present disclosure, by preventing powering of the power management component 113, the power translator component 131 can control the temperature of the power management component 113 such that it is kept within a safe operating temperature range. This can reduce the chance of damage or failure of the power management component 113 in the case of a thermal event. For example, the power management component 113 can tend to experience lower temperatures (e.g., can cool down) in the absence of power supplied thereto. By preventing powering of the power management component 113, the temperature of the power management component 113 can be controlled. By controlling the temperature of the power management component 113 by the power translator component 131, the power management component 113 can be kept within a safe operating temperature range.

Figure 2:
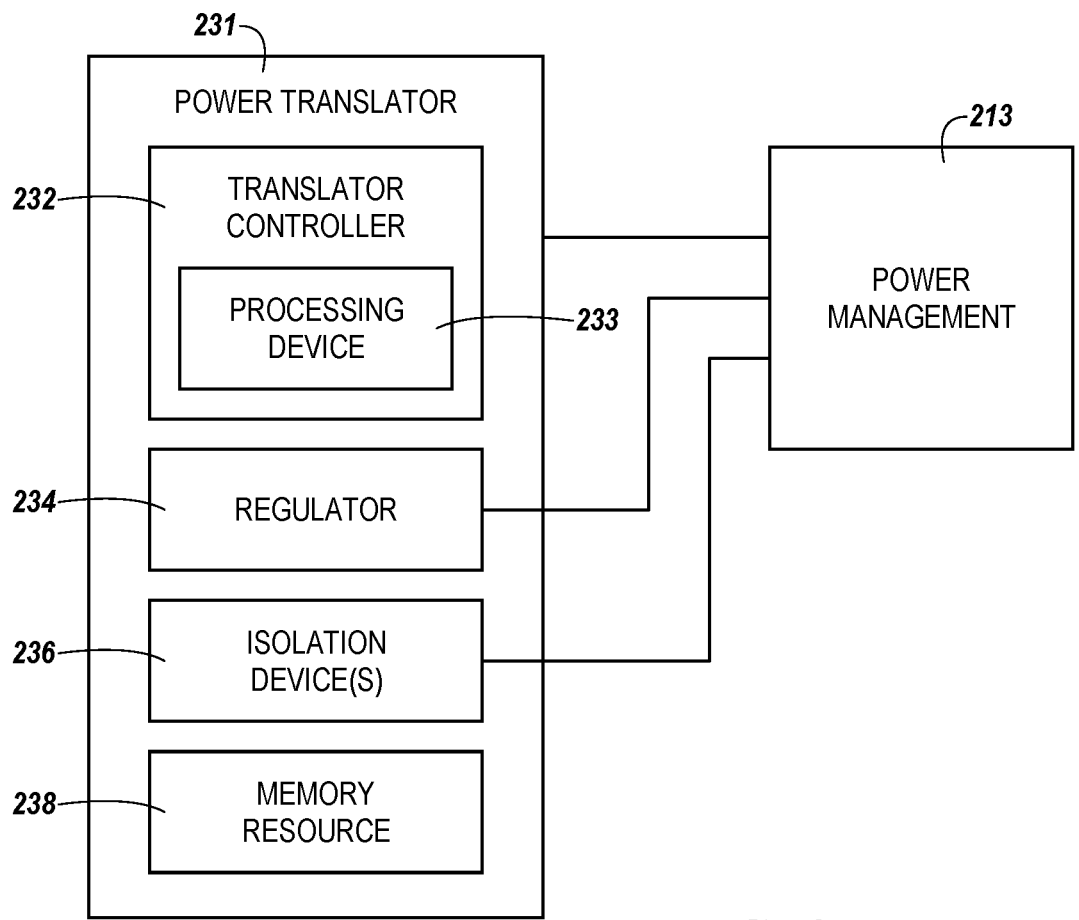
FIG. 2 illustrates an example of a power translator component and a power management component in accordance with some embodiments of the present disclosure.

FIG. 2 illustrates an example of a power management component 213 in accordance with some embodiments of the present disclosure. The power management component 213 is coupled to a power translator component 231, which includes control circuitry such as a translator controller 232, which can include a processing device. Although shown as being included in the translator controller 232, the processing device 233 can be external to the translator controller 232, or a portion of the processing device 233 can be co-located with the translator controller 232 and another portion of the processing device 233 can be external to the translator controller 232. In some embodiments, the processing device 233 (or a portion thereof) can be external to the power translator component 231, provided the processing device 233 is communicatively coupled to the power translator component 231 and/or the translator controller 232. The power translator component 231 further includes one or more regulators 234 (e.g., buck regulator(s), boost regulator(s), buck-boost regulator(s), low-dropout regulator(s), etc.), isolation device(s) 236, and/or a memory resource 238. The power management component 213 and the power translator component 231 can be analogous to the power management component 113 and the power translator component 131 illustrated in FIG. 1, herein.

The power translator component 231 can receive power from an external component (not explicitly shown so as to not obfuscate the relevant aspects of the disclosure) and supply a regulated power to the power management component 213. For example, the power translator component 231 can receive a 12 Volt (V) power signal from the external component and regulate the 12V power signal such that a lesser (e.g., a 3.3V) power signal is applied to the power management component 213. For example, the power translator component 231 can control or utilize the regulator 234 to alter an amount of power received by the power translator component 231 and provide a different amount of power to the power management component 213.

In some embodiments, the power translator component 231 can supply back-up power to the power management component 213. For example, the power translator component 231 can supply power to the power management component 213 in the event that a different power source utilized by the power management component 213 fails or is otherwise unable to provide power to the power management component 213. In addition to, or in the alternative, the power translator component 231 can, in some embodiments, supply power (or back-up power) to a memory component, such as the memory components 112A to 112N illustrated in FIG. 1, herein.

As described above, the power translator component 231 can receive temperature information from the power management component 213 (e.g., information corresponding to a temperature of the power management component 213) and/or an indication form the power management component 213 that the power management component 213 is experiencing, or has experienced, a thermal event. In embodiments in which the power translator component 231 receives temperature information form the power management component 213, the processing device 233 can be configured to determine if the temperature information is indicative of a temperature that is near or above a safe (e.g., a threshold) operating temperature of the power management component 213. For example, the processing device 233 can be configured to determine that the temperature information received from the power management component 213 corresponds to the power management component 213 experiencing a thermal event such as an over temperature or thermal runaway event.

In response to determining that the temperature information is indicative of a temperature that is near or above a threshold operating temperature of the power management component 213 (e.g., temperature information indicative of the power management component 213 experiencing a thermal event), the power translator component 231 can prevent powering, at least temporarily, of the power management component 231. For example, the power translator component 231 can enable the isolation device(s) 236 to prevent a power signal from traversing a communication path coupling the power translator component 231 to the power management component 213. Embodiments are not so limited, however, and in some embodiments, the power translator component 231 can control the regulator 234 to prevent a power signal from being sent from the power translator component 231 to the power management component 213. In some embodiments, the power translator component 231 can selectively disable one or more power configuration pins (e.g., one or more pins associated with the power translator component 231 and communicatively coupled to the power management component 213 and configured to transfer a power signal from the power translator component 231 to the power management component 213) associated with the power translator component 231. In addition to, or in the alternative, the power translator component 231 can shut down, thereby preventing a power signal from being sent from the power translator component 231 to the power management component 213.

In embodiments in which the power translator component 231 receives an indication from the power management component 213 that the power management component 213 is experiencing, or has experienced, a thermal event, the power translator component 231 can prevent powering of the power management component 213, as described above. For example, in response to receipt of the indication that the power management component 213 is experiencing, or has experienced, a thermal event, the isolation device(s) 236 (e.g., transistors) of the power translator component 231 can be operated to discontinue provision of a power signal (e.g., voltage signal) to the power management component 213. As another example, the regulator 234 can be controlled to discontinue providing the power signal to the power management component 213, and/or the power translator component 231 can be shut down.

The power translator component 231 can store the received temperature information and/or the indication that the power management component 213 is experiencing, or has experienced, a thermal event in the memory resource 238. The memory resource 238 can include volatile memory, non-volatile memory, or combinations thereof. The memory resource 238 can be configured such that the temperature information (e.g., the temperature information corresponding to the power management component 213) is stored and accessible even if the power management component 213 loses power or fails subsequent to transferring the temperature information to the power translator component 231. In some embodiments, the memory resource 238 can be configured such that the indication that the power management component 213 is experiencing, or has experienced, a thermal event is stored and accessible even if the power management component 213 loses power or fails subsequent to transferring the indication that the power management component 213 is experiencing, or has experienced, a thermal event to the power translator component 231.

In contrast to approaches in which temperature information detected by the power management component 213 is stored in volatile memory on or within the power management component 213, and is therefore susceptible to being lost or destroyed in a thermal event, embodiments herein allow for the power management component 213 temperature information and/or the indication that the power management component 213 is experiencing, or has experienced, a thermal event to be stored in the memory resource 238 of the power translator component 231. Accordingly, embodiments herein can allow for the temperature information and/or the indication that the power management component 213 is experiencing, or has experienced, a thermal event to be accessible for diagnostic and/or troubleshooting purposes in the event that the power management component fails due to a thermal event (or experiences a failure due to other circumstances). For example, the temperature information and/or the indication that the power management component 213 is experiencing, or has experienced, a thermal event can be accessed as part of a return merchandise authorization and used in diagnostic and/or troubleshooting of the power management component 213 to glean an understanding of events that led to the power management component 213 experiencing the thermal event.

Figure 3:
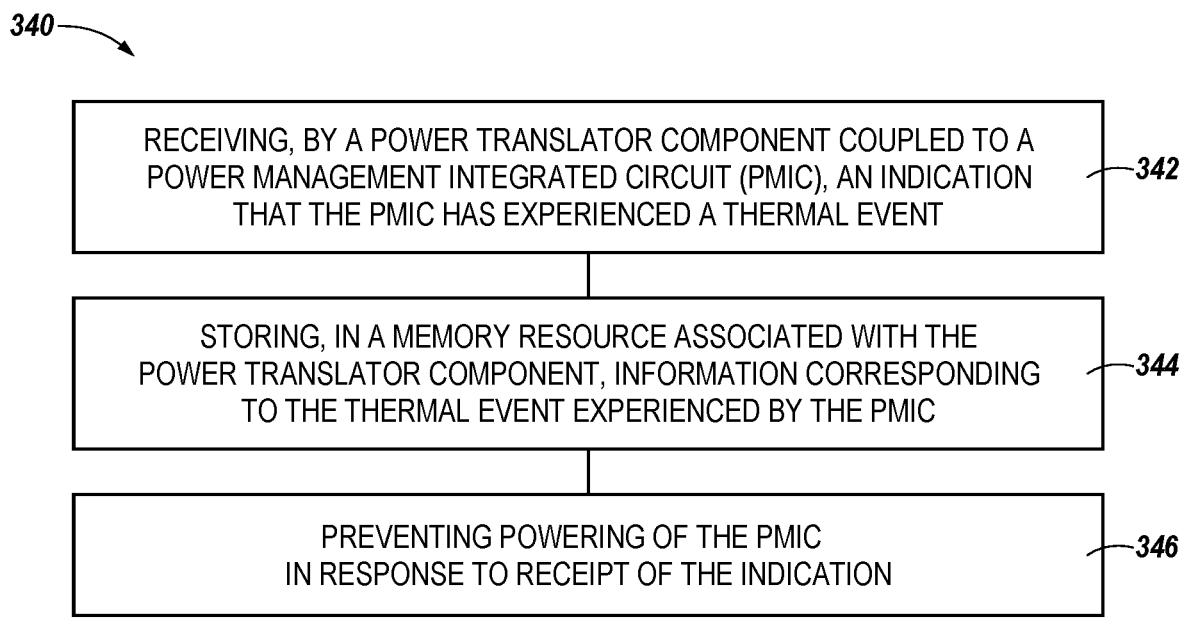
FIG. 3 is a flow diagram of an example method corresponding to a power translation component in accordance with some embodiments of the present disclosure.

FIG. 3 is a flow diagram of an example method 340 corresponding to a power translator component, in accordance with some embodiments of the present disclosure. The method 340 can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. In some embodiments, the method 340 is performed by the power translator component 131 of FIG. 1 and/or the power translator component 231 of FIG. 2. Although shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. Other process flows are possible.

At block 342, the method 340 can include receiving, by a power translator component coupled to a power management integrated circuit (PMIC), an indication that the PMIC has experienced a thermal event. In some embodiments, the power translator component can be analogous to the power translator component 131 and 231 illustrated in FIG. 1 and FIG. 2, herein and the PMIC can be analogous to the power management component 113 and 213 illustrated in FIG. 1 and FIG. 2, herein. The indication that the PMIC has experienced a thermal event can include information corresponding to a temperature at which the PMIC is operating, an indication that the PMIC is near to experiencing, is experiencing, or has experienced an over temperature event, and/or an indication that the PMIC is near to experiencing, is experiencing, or has experienced a thermal runaway event.

In some embodiments, the power translator component can determine, based on the received indication that the PMIC has experienced (or is experiencing) a particular type or class of thermal event. For example, the method 340 can include determining, by the power translator component, that the thermal event experienced by the PMIC is an over temperature event. Embodiments are not so limited, however, and in some embodiments, the method 340 can include determining, based on the received indication received by the power translator component, that the PMIC has experienced, or is experiencing, a thermal runaway event, a workload that satisfies a workload threshold (e.g., a workload greater than a threshold workload), a thermal event that corresponds to an electrical short occurring within the PMIC, or other thermal event.

At block 344, the method 340 can include storing, in a memory resource associated with the power translator component, information corresponding to the thermal event experienced by the PMIC. The memory resource can be analogous to the memory resource 238 illustrated in FIG. 2, herein. As described above in connection with FIG. 2, the information can include temperature information detected by the PMIC. The temperature information can, in some embodiments, be stored by the memory resource associated with the power translator component for subsequent retrieval for diagnostic and/or troubleshooting purposes, as described above.

At block 346, the method 340 can include preventing powering of the PMIC in response to receipt of the indication. In some embodiments, the method 340 can include preventing, at least temporarily, powering of the PMIC in response to receipt of the indication. As described in connection with FIG. 1 and FIG. 2, preventing powering of the PMIC can include enabling isolation device(s) (e.g., the isolation device(s) 236 illustrated in FIG. 2), controlling a regulator associated with the power translator component (e.g., the regulator 234 illustrated in FIG. 2), selectively disabling a power configuration pin coupled to the power translator component, and/or shutting down the power translator component.

In some embodiments, preventing powering of the PMIC can include preventing powering of the PMIC for a predetermined threshold period of time; however, embodiments are not so limited, and, in some embodiments, preventing powering of the PMIC can include preventing powering of the PMIC until an indication that the PMIC has returned to a temperature below a threshold operating temperature is received by the power translator component and/or preventing powering of the PMIC for a period of time determined by the power translator component based on the information corresponding to the thermal event experienced by the PMIC. For example, in some embodiments, the method 340 can include determining, by the power translator component, that the PMIC is no longer experiencing the thermal event and providing power to the PMIC in response to determining that the PMIC is no longer experiencing the thermal event.

Prior to receiving the indication that the PMIC has experienced the thermal event, the method 340 can include providing, by the power translator component, power to the PMIC. In some embodiments, providing power to the PMIC by the power translator can include providing back-up power and/or regulated power to the PMIC, as described in connection with FIG. 1 and FIG. 2, herein.

Figure 4:
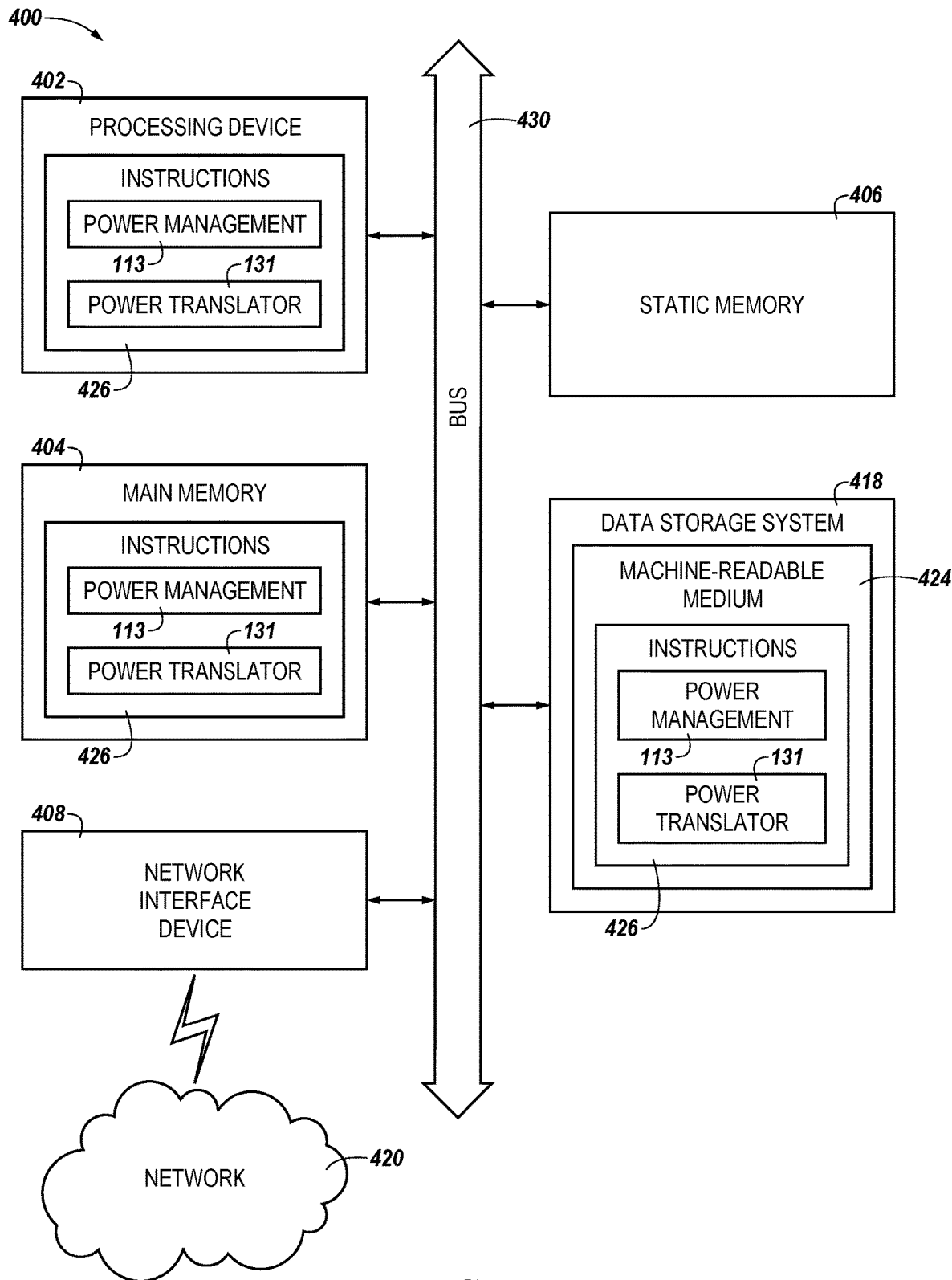
FIG. 4 is a block diagram of an example computer system in which embodiments of the present disclosure may operate.

FIG. 4 illustrates an example machine of a computer system 400 within which a set of instructions, for causing the machine to perform any one or more of the methodologies discussed herein, can be executed. In some embodiments, the computer system 400 can correspond to a host system (e.g., the host system 120 of FIG. 1) that includes, is coupled to, or utilizes a memory sub-system (e.g., the memory sub-system 110 of FIG. 1) or can be used to perform the operations of a controller (e.g., to execute an operating system to perform operations corresponding to the power translator component 131 of FIG. 1). In alternative embodiments, the machine can be connected (e.g., networked) to other machines in a LAN, an intranet, an extranet, and/or the Internet. The machine can operate in the capacity of a server or a client machine in client-server network environment, as a peer machine in a peer-to-peer (or distributed) network environment, or as a server or a client machine in a cloud computing infrastructure or environment.

The machine can be a personal computer (PC), a tablet PC, a set-top box (STB), a Personal Digital Assistant (PDA), a cellular telephone, a web appliance, a server, a network router, a switch or bridge, or any machine capable of executing a set of instructions (sequential or otherwise) that specify actions to be taken by that machine. Further, while a single machine is illustrated, the term "machine" shall also be taken to include any collection of machines that individually or jointly execute a set (or multiple sets) of instructions to perform any one or more of the methodologies discussed herein.

The example computer system 400 includes a processing device 402, a main memory 404 (e.g., read-only memory (ROM), flash memory, dynamic random access memory (DRAM) such as synchronous DRAM (SDRAM) or Rambus DRAM (RDRAM), etc.), a static memory 406 (e.g., flash memory, static random access memory (SRAM), etc.), and a data storage system 418, which communicate with each other via a bus 430.

The processing device 402 represents one or more general-purpose processing devices such as a microprocessor, a central processing unit, or the like. More particularly, the processing device can be a complex instruction set computing (CISC) microprocessor, reduced instruction set computing (RISC) microprocessor, very long instruction word (VLIW) microprocessor, or a processor implementing other instruction sets, or processors implementing a combination of instruction sets. The processing device 402 can also be one or more special-purpose processing devices such as an application specific integrated circuit (ASIC), a field programmable gate array (FPGA), a digital signal processor (DSP), network processor, or the like. The processing device 402 is configured to execute instructions 426 for performing the operations and steps discussed herein. The computer system 400 can further include a network interface device 408 to communicate over the network 420.

The data storage system 418 can include a machine-readable storage medium 424 (also known as a computer-readable medium) on which is stored one or more sets of instructions 426 or software embodying any one or more of the methodologies or functions described herein. The instructions 426 can also reside, completely or at least partially, within the main memory 404 and/or within the processing device 402 during execution thereof by the computer system 400, the main memory 404 and the processing device 402 also constituting machine-readable storage media. The machine-readable storage medium 424, data storage system 418, and/or main memory 404 can correspond to the memory sub-system 110 of FIG. 1.

In one embodiment, the instructions 426 include instructions to implement functionality corresponding to a power translator component (e.g., the power translator component 131 of FIG. 1). While the machine-readable storage medium 424 is shown in an example embodiment to be a single medium, the term "machine-readable storage medium" should be taken to include a single medium or multiple media that store the one or more sets of instructions. The term "machine-readable storage medium" shall also be taken to include any medium that is capable of storing or encoding a set of instructions for execution by the machine and that cause the machine to perform any one or more of the methodologies of the present disclosure. The term "machine-readable storage medium" shall accordingly be taken to include, but not be limited to, solid-state memories, optical media, and magnetic media.

Some portions of the preceding detailed descriptions have been presented in terms of algorithms and symbolic representations of operations on data bits within a computer memory. These algorithmic descriptions and representations are the ways used by those skilled in the data processing arts to most effectively convey the substance of their work to others skilled in the art. An algorithm is here, and generally, conceived to be a self-consistent sequence of operations leading to a desired result. The operations are those requiring physical manipulations of physical quantities. Usually, though not necessarily, these quantities take the form of electrical or magnetic signals capable of being stored, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. The present disclosure can refer to the action and processes of a computer system, or similar electronic computing device, that manipulates and transforms data represented as physical (electronic) quantities within the computer system's registers and memories into other data similarly represented as physical quantities within the computer system memories or registers or other such information storage systems.

The present disclosure also relates to an apparatus for performing the operations herein. This apparatus can be specially constructed for the intended purposes, or it can include a general purpose computer selectively activated or reconfigured by a computer program stored in the computer. Such a computer program can be stored in a computer readable storage medium, such as, but not limited to, any type of disk including floppy disks, optical disks, CD-ROMs, and magnetic-optical disks, read-only memories (ROMs), random access memories (RAMs), EPROMs, EEPROMs, magnetic or optical cards, or any type of media suitable for storing electronic instructions, each coupled to a computer system bus.

The algorithms and displays presented herein are not inherently related to any particular computer or other apparatus. Various general purpose systems can be used with programs in accordance with the teachings herein, or it can prove convenient to construct a more specialized apparatus to perform the method. The structure for a variety of these systems will appear as set forth in the description below. In addition, the present disclosure is not described with reference to any particular programming language. It will be appreciated that a variety of programming languages can be used to implement the teachings of the disclosure as described herein.

The present disclosure can be provided as a computer program product, or software, that can include a machine-readable medium having stored thereon instructions, which can be used to program a computer system (or other electronic devices) to perform a process according to the present disclosure. A machine-readable medium includes any mechanism for storing information in a form readable by a machine (e.g., a computer). In some embodiments, a machine-readable (e.g., computer-readable) medium includes a machine (e.g., a computer) readable storage medium such as a read only memory ("ROM"), random access memory ("RAM"), magnetic disk storage media, optical storage media, flash memory components, etc.

In the foregoing specification, embodiments of the disclosure have been described with reference to specific example embodiments thereof. It will be evident that various modifications can be made thereto without departing from the broader spirit and scope of embodiments of the disclosure as set forth in the following claims. The specification and drawings are, accordingly, to be regarded in an illustrative sense rather than a restrictive sense.

What is claimed is:

1. An apparatus, comprising:
a power management integrated circuit (PMIC) disposed on a solid-state drive (SSD); and
power management circuitry coupled to the PMIC and disposed on the SSD, wherein the power management circuitry is configured to:
generate a regulated power signal from a received power signal;
supply the regulated power signal to the PMIC; and
responsive to receipt of an indication that the PMIC has experienced a thermal event, operate an isolation device associated with the power management circuitry to prevent powering of the PMIC by selectively disabling a power configuration pin associated with the power management circuitry; and
a memory resource disposed on the power management circuity, wherein the memory resource is configured to store information corresponding to the thermal event experienced by the PMIC such that the information corresponding to the thermal event experienced by the PMIC is accessible subsequent to the PMIC experiencing a failure condition in response to the thermal event.

2. The apparatus of claim 1, wherein the thermal event comprises a thermal runaway event.

3. The apparatus of claim 1, wherein the thermal event comprises a condition in which the PMIC is operating at or above a threshold temperature.

4. The apparatus of claim 1, wherein:
the PMIC includes a thermal sensor, and
the PMIC is configured to generate the indication that the PMIC has experienced the thermal event based on information measured by the thermal sensor.

5. The apparatus of claim 1, wherein the power management circuitry is further configured to:
determine that powering of the PMIC has been prevented for a threshold period of time; and
provide power to the PMIC subsequent to expiration of the threshold period of time.

6. The apparatus of claim 1, wherein the indication includes information indicating that the thermal event experienced by the PMIC corresponds to performance of a workload by the PMIC.

7. A method, comprising:
receiving, by power management circuitry disposed on a solid-state drive (SSD) coupled to a power management integrated circuit (PMIC) disposed on the SSD, a power signal;
generating a regulated power signal;

supplying the regulated power signal to the PMIC;
preventing powering of the PMIC in response to receipt of signaling indicative of the PMIC experiencing a thermal event by selectively disabling a power configuration pin coupled to the power management circuitry; and
storing, in a memory resource disposed on the power management circuitry, information corresponding to the thermal event experienced by the PMIC in a persistent manner such that the information corresponding to the thermal event experienced by the PMIC is accessible subsequent to the PMIC experiencing a failure condition in response to the thermal event.

8. The method of claim 7, further comprising providing, prior to preventing powering of the PMIC, back-up power to the PMIC via the power management circuitry.

9. The method of claim 7, further comprising determining, by the power management circuitry, that the thermal event experienced by the PMIC is an over temperature event.

10. The method of claim 7, further comprising:
determining, by the power management circuitry, that the PMIC is no longer experiencing the thermal event; and
providing power to the PMIC in response to determining that the PMIC is no longer experiencing the thermal event.

11. The method of claim 7, wherein preventing powering of the PMIC in response receipt of the indication comprises enabling isolation circuitry associated with the power management circuitry to prevent a voltage from being supplied by the power management circuitry to the PMIC.

12. The method of claim 7, further comprising determining, by the power management circuitry, that the thermal event experienced by the PMIC corresponds to an electrical short within the PMIC.

13. A power management system, comprising:
a power management integrated circuit (PMIC) disposed on a solid-state drive (SSD) and configured to manage power supplied to a plurality of memory components; and
power management circuitry disposed on the SSD, the power management circuitry comprising at least one voltage regulator comprising isolation circuity, wherein the power management circuitry is configured to provide a back-up power supply source to the PMIC, and wherein the PMIC is configured to:
generate information corresponding to a thermal event experienced by the PMIC; and
transfer the information to the power management circuitry, and wherein the power management circuitry is configured to:
regulate a received power signal to reduce an amount of power associated with the power signal to generate a regulated power signal;
supply, as part of providing back-up power to the PIMIC, the regulated power signal to the PMIC;
enable the isolation circuitry to prevent powering of the PMIC based on the received information and
store the information corresponding to the thermal event experienced by the PMIC in a memory resource disposed on the power management circuitry such that the information corresponding to the thermal event experienced by the PMIC is accessible subsequent to the PMIC experiencing a failure condition in response to the thermal event.

14. The system of claim 13, wherein the isolation circuitry comprises at least one transistor.

15. The system of claim 13, wherein the information corresponding to the thermal event experienced by the PMIC includes temperature information measured by a thermal sensor resident on the PMIC.

16. The system of claim 13, wherein the information corresponding to the thermal event experienced by the PMIC includes information corresponding to a workload experienced by the PMIC.

17. The system of claim 13, wherein:
the PMIC further comprises a PMIC status condition pin configured to transfer the information to the power translator component, and
the power management circuitry further comprises a status condition pin configured to receive the information corresponding to a status condition of the PMIC.

* * * * *